INVENTOR.
PETER LEFFERTS
BY
Morgan, Finnegan, Durham & Pine
ATTORNEYS.

INVENTOR.
PETER LEFFERTS

BY

Morgan, Finnegan, Durham & Pine
ATTORNEYS.

INVENTOR.
PETER LEFFERTS
BY
Morgan, Finnegan, Durham & Pine
ATTORNEYS.

United States Patent Office 3,314,242
Patented Apr. 18, 1967

3,314,242
PORTABLE THERMOELECTRIC COOLING DEVICE AND METHOD OF MAKING THE SAME
Peter Lefferts, Hopewell, N.J., assignor to TIA Electric Company, Princeton, N.J.
Filed Aug. 30, 1965, Ser. No. 483,595
8 Claims. (Cl. 62—3)

This invention relates to portable cooling devices and methods for making the same.

There is hardly a scientific laboratory which does not have a small portable heat source usually in the form of a Bunsen burner. However, very few laboratories have the counterpart of the portable heat source which will provide cooling below room temperature even though such a device would be generally useful and sometimes essential for experimental work. For example, a portable cold source would be useful to control the growth rate in biological experiments, to control the reaction rate of chemical reactions, for maintaining a water-ice mixture over an indefinite period of time, for hardening thermoplastic and wax materials, or to produce temporary cold storage for drugs and chemicals.

A portable cooling device also has considerable use outside the laboratory, particularly in connection with exothermic cements such as epoxy which are often used in assembly processes. Epoxy cement sets rather rapidly at room temperature and, hence, when used in a production facility there is the continuous problem of mixing up new batches of cement. The setting of the epoxy cement is essentially an exothermic reaction, and therefore, if heat is absorbed from the mixture the reaction rate is reduced. The useful life of a batch of epoxy cement can easily be doubled and can often be increased by a factor of three or four if the temperature is reduced by means of a suitable cooling unit.

An object of this invention is to provide a portable cooling device suitable for use in laboratories and the like.

Another object is to provide a portable cooling device suitable for removing heat from exothermic reactions such as experienced with epoxy cements and the like.

The portable cooling device in accordance with this invention includes a thermoelectric module disposed between a heat sink for dissipating the heat and a cold sink for providing useful cooling. In the thermoelectric module the hot and cold junctions include the current carrying conductors which form the connection between the individual semiconductive thermoelectric elements. The associated hot and cold sinks must be constructed from thermally conductive materials such as aluminum, and hence, are usually electrically conductive also. Therefore, in assembling the cooling unit the module must be bonded between the sinks so as to provide a thermally conductive coupling and electrical resistance. This is difficult to achieve economically since thermally conductive materials normally have very little electrical resistance.

Thus, a further object of the invention is to provide a method and apparatus for bonding a thermoelectric module to the hot and cold sinks in a manner which provides thermal coupling and sufficient electrical resistance to prevent short circuits between the electrical conductors of the module.

The foregoing and other objects will become apparent from the following specification which sets forth an illustrative embodiment of the invention. The drawings form part of this specification wherein.

Figure 1:
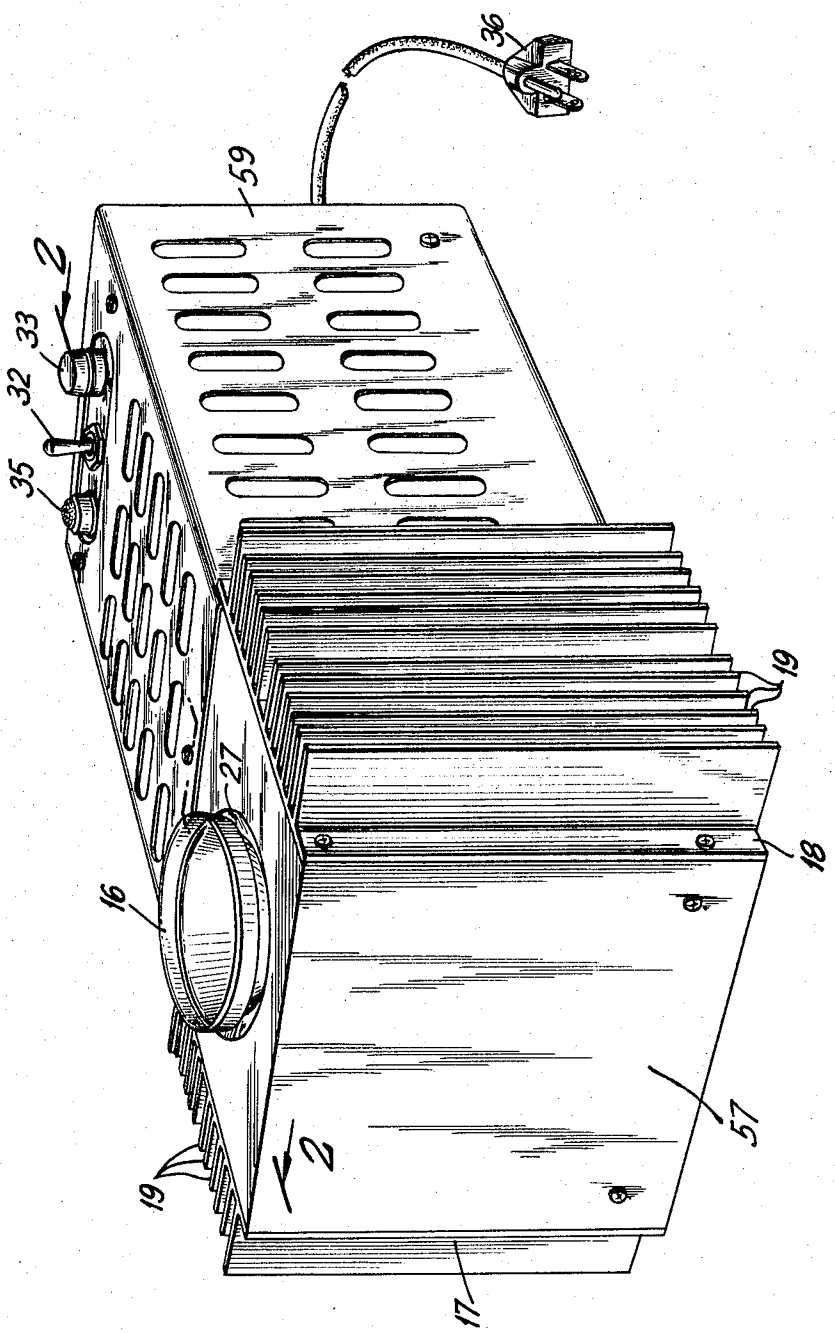
FIGURE 1 is a perspective view showing the completely assembled portable cooling device in accordance with this invention.
Figure 2:
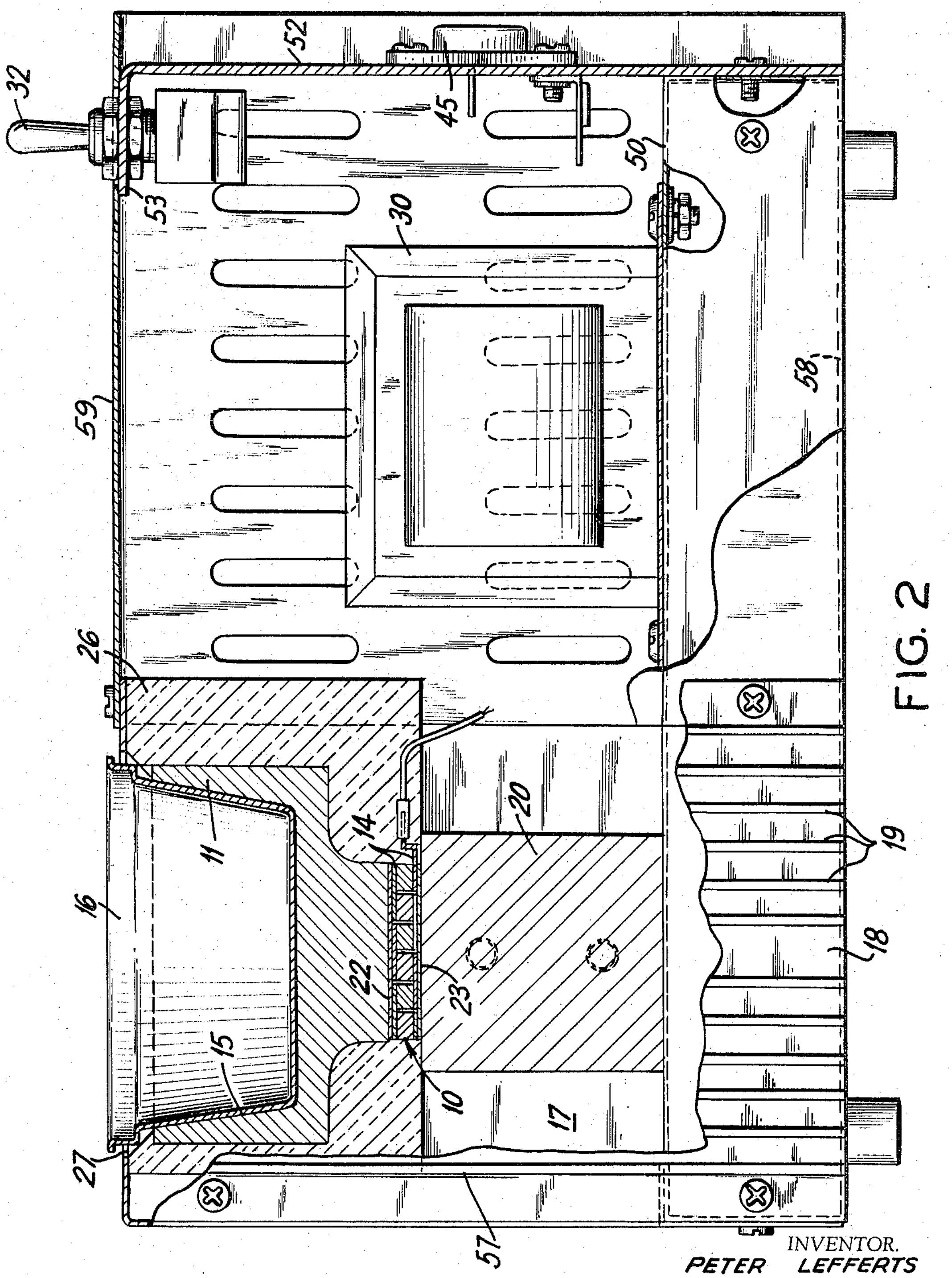
FIGURE 2 is a cross-sectional view of the same taken along the line 2—2 in FIGURE 1.

The portable cooling unit in accordance with this invention includes a thermoelectric module 10 disposed between a cup-shaped cold sink 11 and a heat sink structure 12. The thermoelectric module consists of dissimilar semiconductive elements which are connected in series to provide a number of hot and cold junctions. The current passes alternately through elements having positive and negative Seebeck coefficients, these elements being designated P and N, respectively, in the drawings. The semiconductive elements are interconnected by copper conductors 14 and are oriented so that, with current in the proper direction, all of the cold junctions are adjacent cold sink 11 and all of the hot junctions are adjacent heat sink 12. Thus, as current flows through the thermoelectric module, heat is pumped from the cold sink from where it is dissipated into the surrounding atmosphere. Note that the copper conductors 14 form part of the hot and cold junctions, and hence, the heat being transferred must pass through these conductors.

Figures 3, 4:
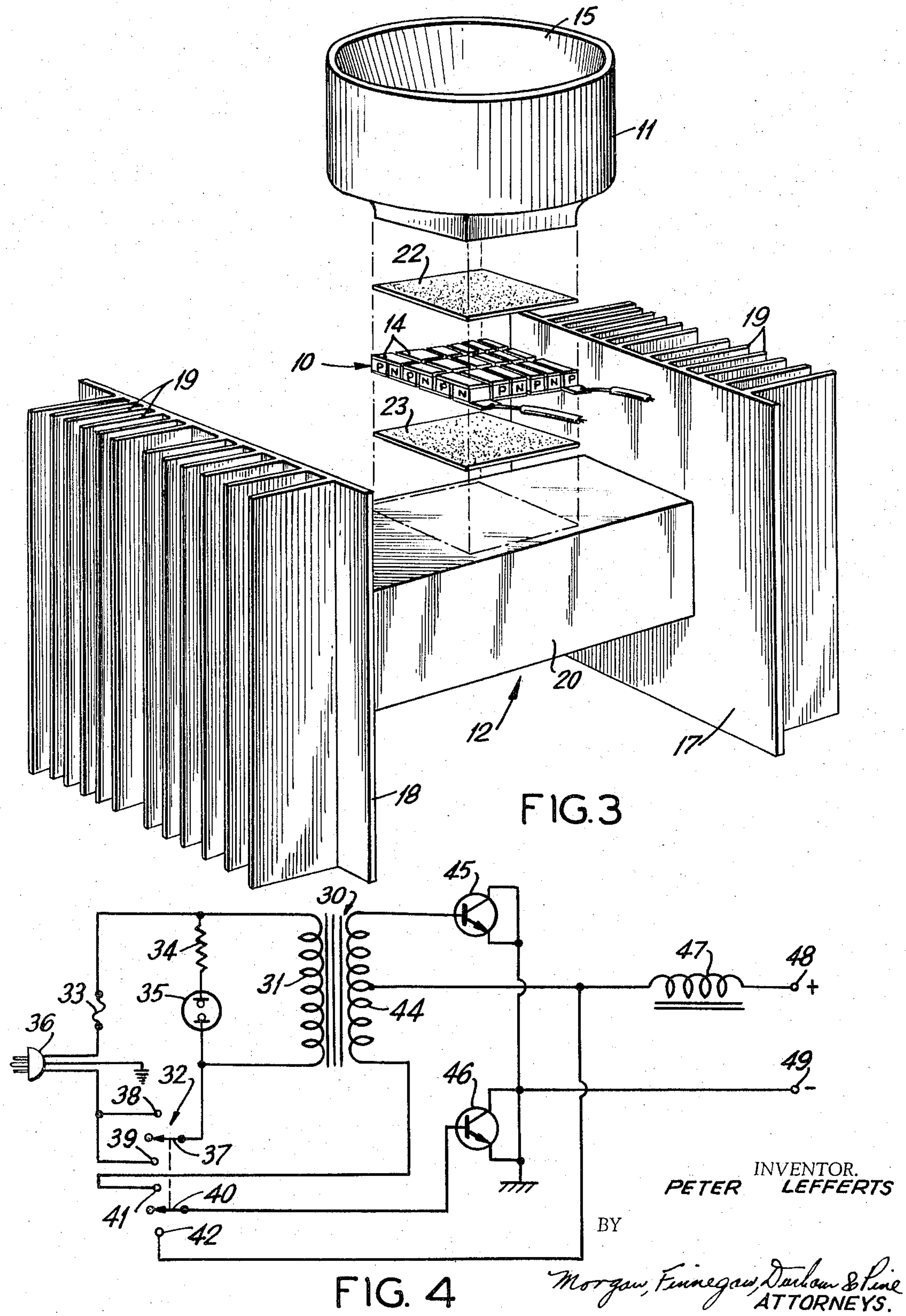
FIGURE 3 is an exploded assembly drawing illustrating the manner in which the thermoelectric module is bonded to the hot and cold sinks.
FIGURE 4 is a schematic diagram illustrating the power supply for the thermoelectric module.

The cup-shaped cold sink 11, is a sand cast aluminum unit having a cylindrical exterior surface and a rectangular boss extending from the bottom as shown in FIGURE 3. The rectangular boss is approximately the same size as the thermoelectric module, and is preferably machined to provide a finished surface. A tapered frustroconical opening 15 extends from the upper surface of the cold sink and is designed to match the dimensions of a disposable cup 16 formed from a thermally conductive material such as aluminum foil. When the foil cup is pressed firmly into position within opening 15, it thereafter tends to expand slightly due to the folded or creased structure and thereby establishes proper thermal contact with the sink. The surface of the openings is left in the rough sand cast condition so that this surface will assist in securely holding the foil cup.

Heat sink structure 12 includes a pair of spaced apart extruded aluminum heat radiators 17 and 18 each having outwardly extending fins 19 which are exposed to the surrounding atmosphere. The heat radiators 17 and 18 are rigidly secured to opposite ends of a large solid aluminum bar 20. The structure is designed so that the total mass of heat sink 12 is substantially greater than cold sink 11. This is significant during initial cooling when the heat transfer is greatest since it permits storage of heat in the heat sink while awaiting the relatively slow dissipation of the heat into the naturally circulating air surrounding the radiating surfaces.

A thin sheet 22 of a porous material impregnated with epoxy cement is disposed between conductors 14 of the thermoelectric module and the adjacent surface of sink 11, and a similar sheet of material 23 is disposed between the thermoelectric module and the aluminum bar 20. The sheets of material 22 and 23 should be less than one one-thousandth of an inch thick, should be relatively porous having an open area in excess of fifty percent, should be relatively tear resistant and should not be adversely affected when maintained under pressure continuously. Ordinary tissue paper, or paper of the type commonly used in making electrolytic capacitors, will normally have these desirable characteristics.

The exposed surfaces of conductors 14 and the adjacent surfaces of cold sink 11 and aluminum bar 20 are carefully cleaned and slightly roughened. Epoxy cement is then applied to these surfaces. The sheets 22 and 23 are then pressed into one of the prepared surfaces, and the entire structure is then stacked as shown in FIGURE 3. The sinks are urged toward one another and the assembled unit is then maintained under pressure for about 12 hours at room temperature or (less at higher temperatures) while the epoxy cement sets.

In the assembled unit, the layers of epoxy cement bond thermoelectric module 10 to heat sinks 11 and 12. These layers are relatively thin and therefore provide effective thermal coupling between the module and the sinks. The porous sheets of material act as spacers to prevent any electrical contact between conductors 14 and the adjacent aluminum surfaces of the sinks and thereby provide the needed electrical insulation.

The cold sink is surrounded by a solid foam block of insulating material 26. This is accomplished by surrounding the cold sink and the thermoelectric module with a suitable mold and pouring in a suitable foam material which will solidify and provide heat insulation. The foam insulation preferably extends above the cold sink and has a beveled surface 27 which meets the upper periphery of opening 15. In this manner the entire cold sink, except for opening 15, is surrounded with insulating material.

The power supply for the thermoelectric module is shown schematically in FIGURE 4 and includes a transformer 30 having a primary winding 31 and a center tapped secondary winding 44. One end of primary winding 31 is connected to an A.C. electrical plug 36 via a fuse 33, and the other end of the winding is connected to a movable contact 37 of a double pole double throw switch 32 having a neutral off position. Stationary contacts 38 and 39 associated with movable contact 37 are connected to electrical plug 36. A neon indicating lamp 35 is connected in series with a resistor 34 across primary winding 31.

The center tap of secondary winding 44 is connected to a positive output terminal 48 via a choke coil 47. One end of secondary winding 44 is connected to the base of transistor 45, and the other end is connected to stationary contact 41 associated with movable contact 40 of switch 32. Movable contact 40 is connected to the base of transistor 46 and stationary contact 42 is coupled to choke coil 47. The emitters and collectors of transistors 45 and 46 are connected to ground and negative terminal 49.

When switch 32 is in the upper position, the base of transistor 46 is coupled to one end of secondary winding 44. Under these circumstances the transistors act as diodes and the power supply functions as a full-wave rectifier. When switch 32 is in the lower position, the base of transistor 46 is connected to the center tap of secondary winding 44, and therefore, the power supply functions as a half-wave rectifier. In the latter condition the output voltage has an average value of approximately half of that provided when switch 32 is in the upper position. Terminals 48 and 49 are connected to the terminal of thermoelectric module 10. Transformer 30 and choke coil 47 are mounted on a chassis 50 positioned below aluminum bar 20 and between radiators 17 and 18. The remaining electrical components are mounted on a vertical panel 52 which is secured to one end of the chassis and which has a horizontal flanged upper edge 53. Transistors 45 and 46 are mounted on the outside vertical surface of panel 52 with their terminals extending through the panel to thereby achieve suitable cooling for the transistors. Switch 32, a fuse holder for fuse 33, and a socket for indicating lamp 35 are mounted on horizontal flange 53 and are thereby easily accessible from the top of the unit. The other end of the unit and the bottom below the chassis, are closed by suitable panels 57 and 58. A U-shaped member 59 having ventilating openings 60 therein is placed over the transformer and choke to complete the enclosure. Preferably cover 59 includes an oblong opening 61 dimensioned and positioned so that components 32, 33, and 35 extend through the opening.

While only one illustrative embodiment of the portable cooling unit in accordance with this invention has been illustrated in detail it should be obvious that there are numerous variations within the scope of the invention. Although the technique whereby the sinks are attached to a thermoelectric module has been illustrated with respect to a portable cooling unit, this technique is by no means limited to such units and provides an exceptionally inexpensive and effective way of coupling thermoelectric modules to the associated sinks which is suitable for general use. The scope of the invention is more particularly defined in the appended claims.

What is claimed is:

1. A method of assembling a thermoelectric device including a thermoelectric module disposed between a heat sink and a cold sink, comprising the steps of disposing the thermoelectric module between said sinks; placing thin sheets of porous material between said thermoelectric module and each of said sinks and impregnating said sheets with an adhesive; urging said sinks toward one another and maintaining the same under pressure while said adhesive sets to thereby minimize separation between the thermoelectric module and the respective sinks.

2. A thermoelectric assembly comprising a heat sink; a cold sink; a thermoelectric module disposed between said sinks; a thin porous sheet of material disposed between said module and each of said sinks to separate the same and prevent electrical contact; and an adhesive impregnated in said porous sheet of material and operative to physically bond said thermoelectric module to said sinks and to thermally couple said module to each of said sinks.

3. A thermoelectric assembly in accordance with claim 2 wherein said sheet of porous material is paper less than one one-thousandth of an inch thick and having more than one-half its surface area open.

4. A thermoelectric assembly in accordance with claim 2 wherein said adhesive is an epoxy cement.

5. A portable thermoelectric cooling device comprising a cold sink; a heat sink including a pair of spaced apart heat radiating members, and a thermally conductive bar thermally coupling said heat radiating members, the mass of said heat sink being substantially greater than the mass of said cold sink; a thermoelectric module disposed between said cold sink and said thermally conductive bar; and means between said thermoelectric module and said sinks for physically bonding said module to said sinks, for thermally coupling said module to said sinks, and for electrically insulating said module from said sinks, said means comprising a thin sheet of porous material impregnated with an adhesive.

6. A portable thermoelectric cooling device in accordance with claim 5 wherein said means comprises a thin sheet of porous paper impregnated with epoxy cement.

7. A portable thermoelectric cooling device comprising a cold sink having a frustroconical opening therein adapted to hold a disposable metal foil cup which tends to expand after being pressed into said opening; a heat sink; a thermoelectric module disposed between said sinks; and means between said thermoelectric module and said sinks for physically bonding said module to said sinks, for thermally coupling said module to said sinks, and for electrically insulating said module from said sinks, and wherein said heat sink includes a pair of spaced apart heat radiating members, and a thermally conductive bar thermally coupling said heat radiating members, the mass of said heat sink being substantially greater than the mass of said cold sink and wherein said cold sink is surrounded by a heat insulated material.

8. A portable thermoelectric cooling device comprising a cold sink having a frustroconical opening therein adapted to hold a disposable metal foil cup which tends to expand after being pressed into said opening; a heat sink; a thermoelectric module disposed between said sinks; and means between said thermoelectric module and said sinks for physically bonding said module to said sinks, for thermally coupling said module to said sinks, and for electrically insulating said module from said sinks, and wherein said means comprises a thin sheet of porous paper impregnated with epoxy cement.

References Cited by the Examiner

UNITED STATES PATENTS

| | | | |
|---|---|---|---|
| 2,922,284 | 1/1960 | Danielson | 62—3 |
| 2,959,925 | 11/1960 | Frantti | 62—3 |

| | | | |
|---|---|---|---|
| 3,008,300 | 11/1961 | Ryan | 62—3 |
| 3,035,416 | 5/1962 | Wagner | 62—3 |
| 3,177,671 | 4/1965 | Stambaugh | 62—3 |
| 3,178,896 | 4/1965 | Sandsto | 62—3 |
| 3,234,048 | 2/1966 | Nelson | 62—3 |
| 3,243,965 | 4/1966 | Jepson | 62—3 |

WILLIAM J. WYE, *Primary Examiner.*